United States Patent [19]

Dixon

[11] Patent Number: 5,277,596

[45] Date of Patent: Jan. 11, 1994

[54] METHOD OF PRODUCING A CARD EDGE MOUNTED CONNECTOR AND THE RESULTING ASSEMBLY THEREOF

[75] Inventor: Dirk R. Dixon, Elizabethtown, Pa.

[73] Assignee: The Whitaker Corporation, Wilmington, Del.

[21] Appl. No.: 991,700

[22] Filed: Dec. 16, 1992

[51] Int. Cl.⁵ .......................................... H01R 23/70
[52] U.S. Cl. ...................................... 439/79; 29/843; 439/937
[58] Field of Search ................. 439/59, 79, 80, 629, 439/630, 636, 637, 937; 29/832, 834, 840, 843

[56] References Cited

U.S. PATENT DOCUMENTS

| | | |
|---|---|---|
| 4,150,863 | 4/1979 | Krafthefer et al. |
| 4,695,106 | 9/1987 | Feldman et al. ................. 439/83 |
| 4,717,218 | 1/1988 | Ratcliff ................................ 439/59 |
| 4,884,983 | 12/1989 | Morrison ......................... 439/874 |
| 5,004,430 | 4/1991 | DelGuidice et al. ............ 439/350 |

Primary Examiner—Neil Abrams
Attorney, Agent, or Firm—William B. Noll; Bruce J. Wolstoncroft

[57] ABSTRACT

This invention is directed to a method of aligning an electrical receptacle assembly having plural electrical terminals projecting therefrom along only one side of the assembly to the edge of a substantially rectangular, planar conductive panel formed of a dielectric material, such as a printed circuit board (PCB), where such terminals are to be reflow soldered to electrically conductive paths on the surface of said planar conductive panel. The method includes the steps of (a) preparing a conductive panel joined on at least one side thereof with a carrier support portion secured to the conductive panel by plural frangible webs which may be readily severed after the soldering of the contacts to the conductive paths, (b) selecting an electrical receptacle assembly comprising an elongated housing having plural cavities, where each cavity includes an electrical terminal mounted therein, with the ends of the terminals aligned within a plane, and a pair of oppositely disposed tabs extending from the housing, (c) providing an elongated opening within the carrier support portion adjacent to the edge of the conductive panel and of a size to receive the elongated housing, where the tabs are adapted to lie upon the surface of said carrier support portion, and thereafter (d) seating the electrical receptacle assembly within the opening whereby the electrical receptacle assembly is aligned with the conductive paths on the planar conductive panel, and each terminal end contacts a corresponding conductive path on the surface of the planar conductive panel.

10 Claims, 6 Drawing Sheets

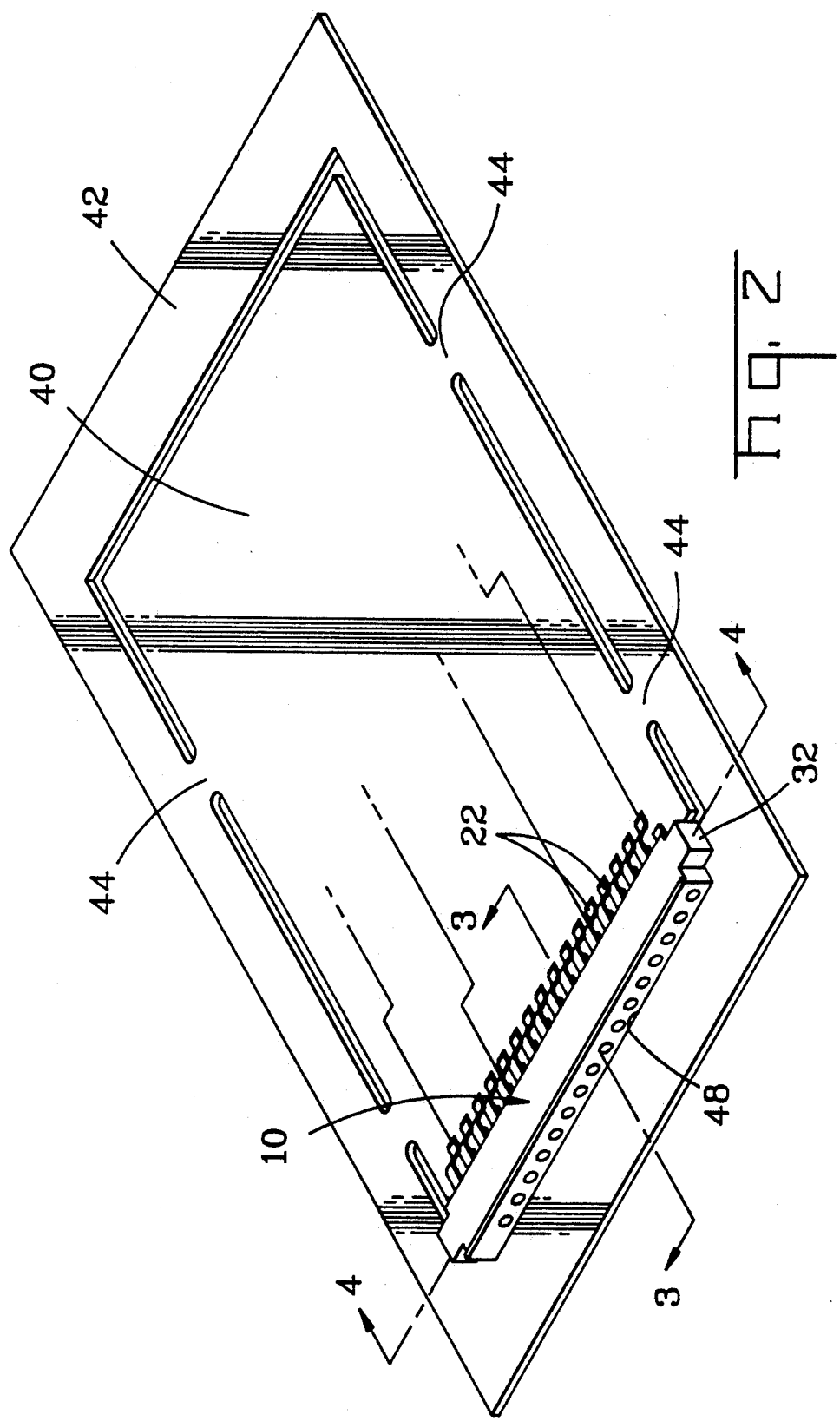

METHOD OF PRODUCING A CARD EDGE MOUNTED CONNECTOR AND THE RESULTING ASSEMBLY THEREOF

BACKGROUND OF THE INVENTION

This invention is directed to the method of aligning a card edge connector to a planar conductive panel, such as a printed circuit board (PCB), without the necessity of plated through holes or board locks, such as found with surface mounted connectors, which thereafter are subjected to soldering of terminals to conductive paths along the planar conductive panel, and to the resulting assembly thereof.

U.S. Pat. No. 4,695,106 is representative of a surface mount connector, preferably to a PCB, where securing same to the PCB is effected by soldering posts or pins to the PCB. The soldering operation, as known in the art, may be accomplished by a number of techniques. By way of example, the soldering operation currently employed in the soldering of electrical connectors to PCBs may involve a vapor phase reflow soldering step, or an alternative soldering operation such as IR heating. This soldering step is used to render solder paste or other conductive medium, previously deposited on the conductive paths or pads, into a molten state so that a solder fillet can be formed with the respective solder tails. Other soldering methods, such as reflow soldering, may also be used in establishing a connection between the retention posts and pads located on the lower surface of the printed circuit boards opposite from the surface mount interconnections.

While the present invention contemplates the use of a soldering operation to effectively secure the connector to the edge of a planar conductive panel, the uniqueness hereof lies in the manner by which the connector is precisely aligned with the conductive paths or pads of a planar conductive panel, preferably a PCB, prior to soldering the terminals of the connector to the conductive panel.

SUMMARY OF THE INVENTION

The invention hereof relates to a method of edge aligning and mounting an electrical connector to a planar conductive panel, such as a PCB. More precisely, the invention relates to a method of aligning an electrical receptacle assembly having plural electrical terminals projecting therefrom along only one side of the assembly to the edge of a substantially rectangular, planar conductive panel, formed of a dielectric material, where the terminals are preferably to be reflow soldered to electrically conductive paths on the surface of the PCB. The method comprises the steps of preparing a conductive panel, such as a PCB, joined on at least one side thereof with a carrier support portion secured to the conductive panel by plural frangible webs which may be readily severed after the soldering of electrical terminals to conductive paths on the PCB. Thereafter, selecting an electrical receptacle assembly comprising an elongated housing having plural cavities, where each cavity includes an electrical terminal mounted therein, where the ends of the terminals are aligned within a plane. At each end of the housing a tab extending therefrom is provided. Next, an elongated opening is formed within the carrier support portion adjacent to the edge and of a size to receive the elongated housing, where the tabs are adapted to lie upon the surface of said carrier support portion. Finally, electrical receptacle assembly is seated within the opening whereby the electrical receptacle assembly is aligned with the conductive paths on the PCB, and each terminal end contacts a corresponding conductive path on the surface of the PCB. The final step, as known in the art, is the soldering of the terminal ends to the PCB, preferably by a solder reflow process.

BRIEF DESCRIPTION OF DRAWINGS

FIG. 2 is a further perspective view showing the electrical receptacle assembly aligned with the planar conductive panel.

FIG. 3 is a partial sectional view taken along line 3—3 of FIG. 2.

DETAILED DESCRIPTION OF PREFERRED EMBODIMENT

The present invention is directed to a method of aligning a card edge connector to a planar conductive panel, such as a printed circuit board (PCB), without the necessity of plated through holes or board locks, such as found with surface mounted connectors. After such alignment, the assembly is subjected to soldering of the connector's terminals to the conductive paths along the planar conductive panel. The resulting assembly is a card edge mounted electrical connector.

Figure 1:
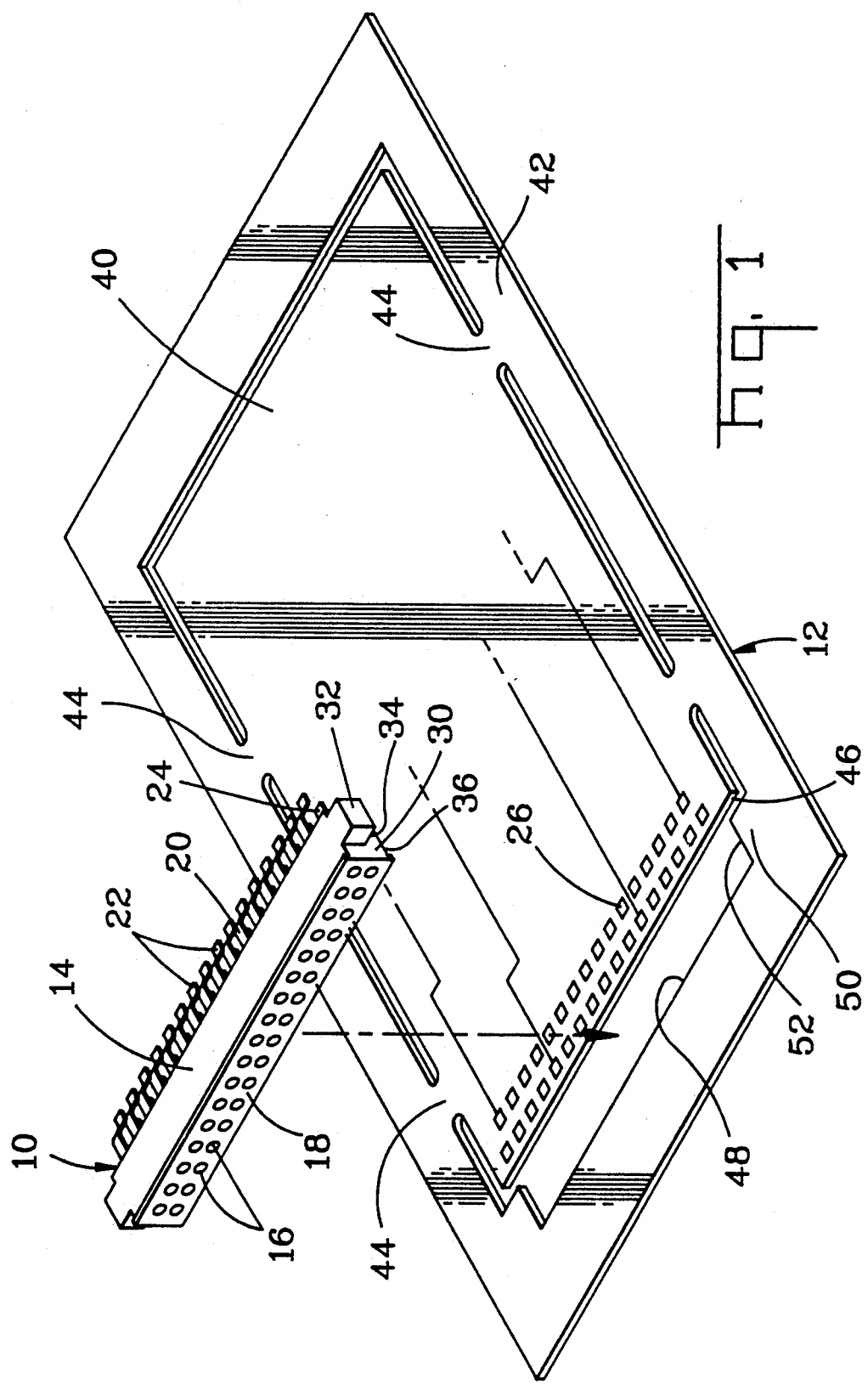
FIG. 1 is an exploded perspective view of an electrical receptacle assembly and planar conductive panel, such as a printed circuit board (PCB), aligning and edge mounting such assembly to the panel according to this invention.

The preliminary step in aligning the electrical receptacle assembly 10 with the planar conductive panel 12, preferably a printed circuit board (PCB), as known in the art, is illustrated in FIG. 1. The electrical connector assembly 10 comprises an elongated housing 14, formed of a dielectric material, such as plastic, having a plurality of through cavities 16, opening from a mating face 18 to a PCB mounting face 20. Projecting from said PCB mounting face is a like number of electrical terminals 22, the ends 24 of which are axially oriented for soldering to respective conductive pads 26 or paths of the PCB. While the connector assembly 10 is illustrated with a pair of aligned rows of cavities, it will be noted, particularly in FIG. 3, that all terminals ends 24 are aligned in a common plane.

Figure 4:
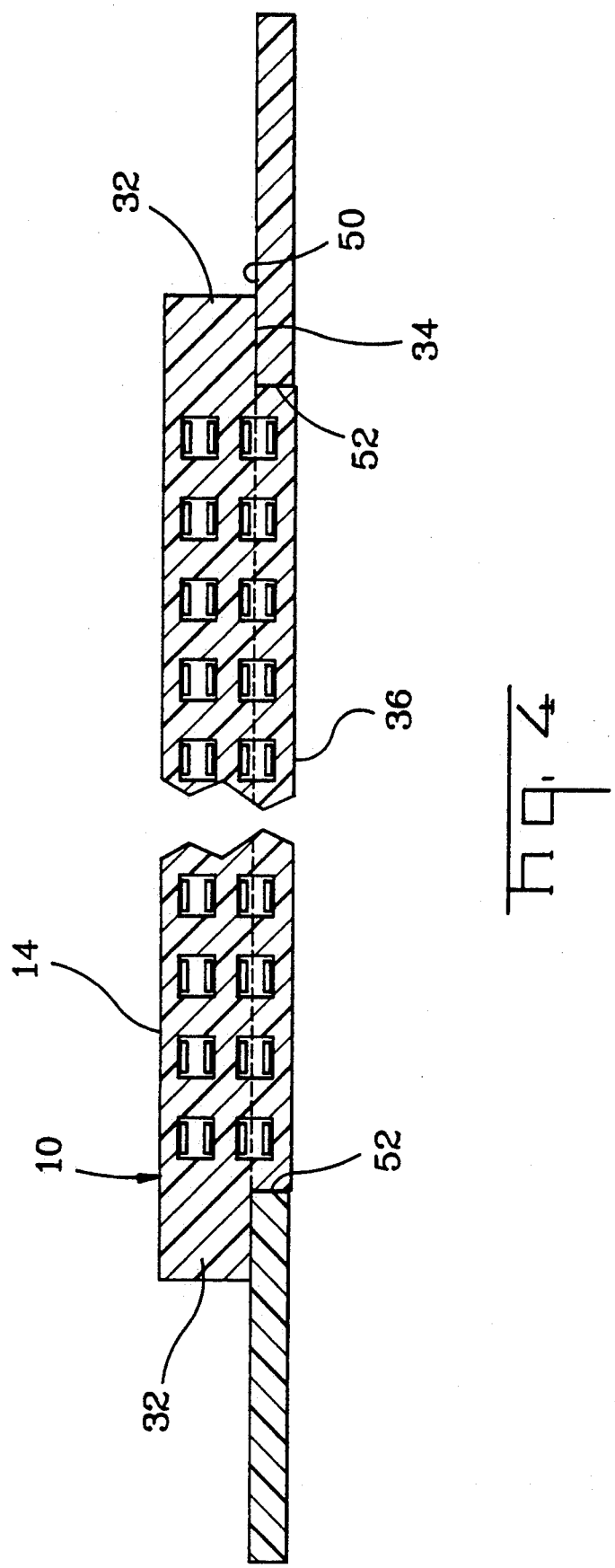
FIG. 4 is a partial sectional view taken along line 4—4 of FIG. 2.
Figure 4:
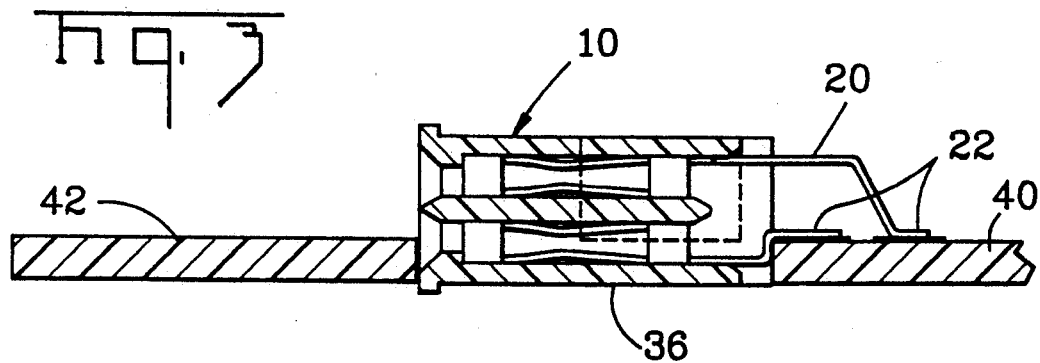

Each side 30 of the elongated housing 14 is provided with a shoulder 32 or projection, where such shoulder 32 has a first recessed edge 34, see FIG. 4. The edge 34, as will be observed in FIGS. 2 and 4, supports the receptacle assembly 10, relative to the planar conductive panel 12, in a manner to be described hereinafter. With said edge 34 recessed a predetermined distance from the housing surface 36, the receptacle assembly 10 can be properly seated to insure the positioning of the terminal ends 24 to the pads 26.

Disposed below the receptacle assembly 10 of FIG. I lies the planar conductive panel 12 to which such assembly is to be mounted. The panel 12, formed of a flat, sheet-like dielectric material, includes an inner panel 40 having a predetermined pattern of conductive pads 26 connected to printed circuitry, as known in the art of printed circuit boards, and peripheral support 42 joined to the inner panel 40 by frangible webs 44. Adjacent at least one edge 46 of the inner panel 40, the peripheral support 42 is provided with an elongated opening 48. The opening 48 is dimensioned to receive in seating engagement the receptacle assembly 10 to be edge mounted to said one edge 46. As noted above, the receptacle assembly 10 includes shoulders 32 which project outside the opening 48 to lie upon support surface 50 along support edge 52. A further purpose of the support edge 52 is to laterally align the receptacle 10 assembly 10 relative to the panel 12. Accordingly, the support edge 52 must be arranged in a predetermined position relative to the pattern of the conductive pads 26. FIGS. 2 and 3 show the receptacle assembly 10 seated within the opening 48 whereby each said terminal end 24 overlies a corresponding conductive pad 26.

Figure 5:
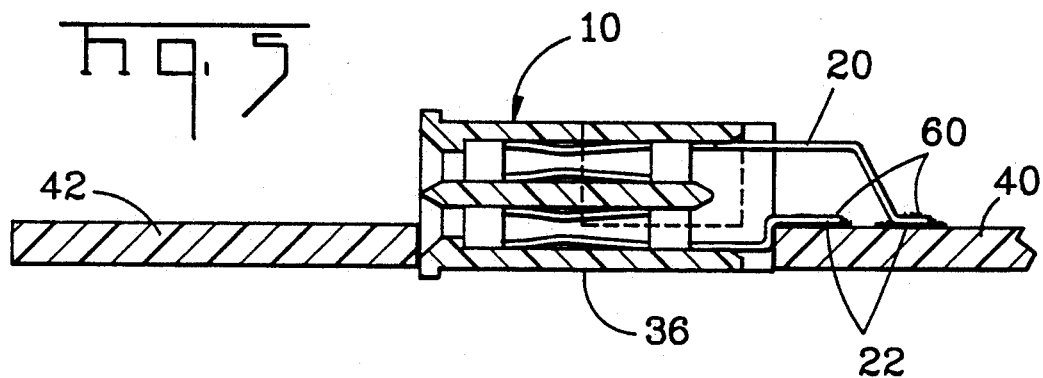
FIG. 5 is a partial sectional view, similar to FIG. 3, showing the electrical terminals projecting from the electrical receptacle assembly and soldered to the planar conductive panel.
Figure 6:
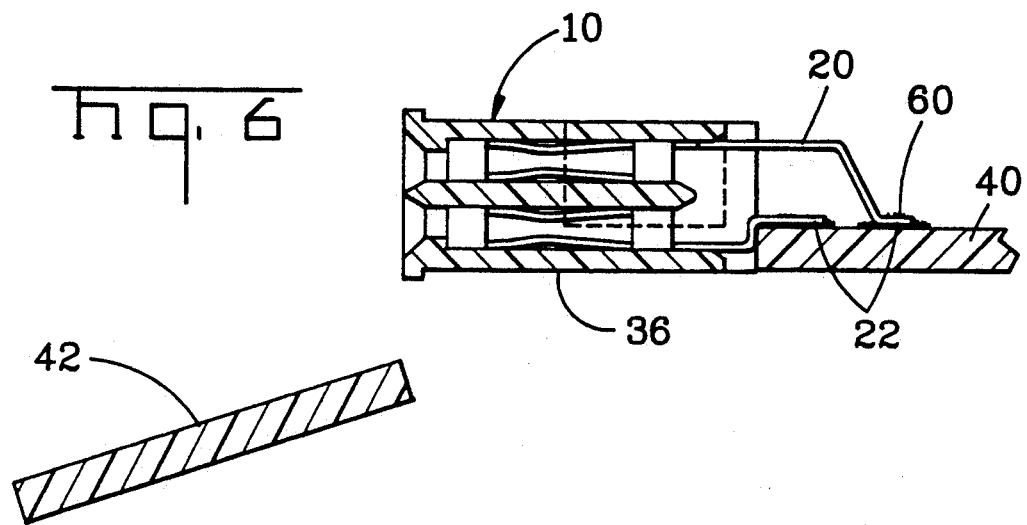
FIG. 6 is a partial sectional view showing an electrical receptacle assembly edge mounted to a planar conductive panel, with the carrier support portion removed from such panel.
Figure 7:
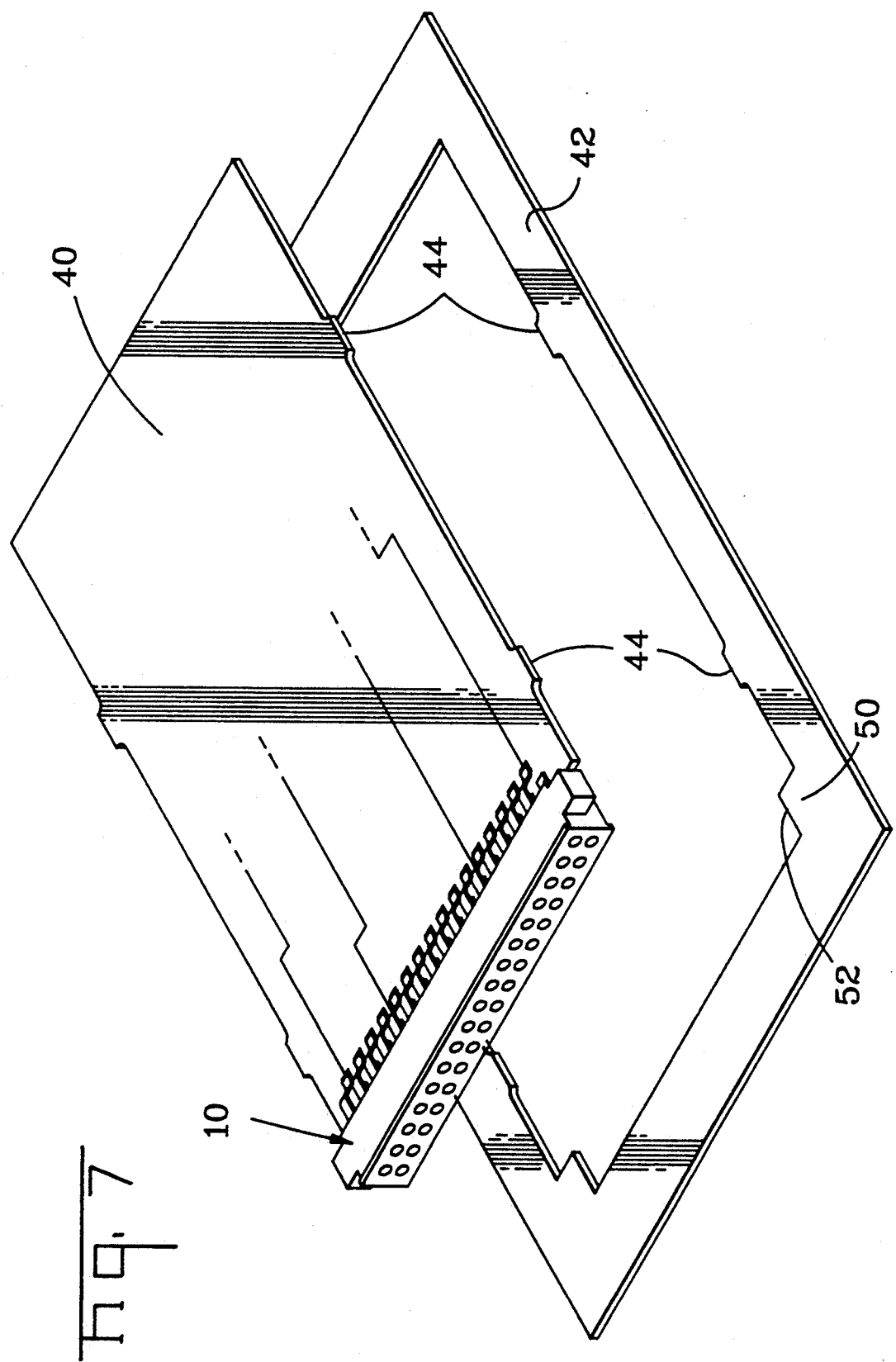
FIG. 7 is a perspective view illustrating an edge mounted electrical connector assembly produced by the method of this invention.

The result of the method of this invention, to produce an edge mounted connector to a PCB, for example, is illustrated in FIG. 7. The method is particularly directed to aligning an electrical receptacle assembly 10 having plural electrical terminals 22 projecting therefrom along only one side 20 of the assembly to the edge 46 of a substantially rectangular, planar conductive panel 40 formed of a dielectric material, where the terminals 22 are to be reflow soldered (see FIG. 5, reference numeral 60) to electrically conductive paths 26 on the surface of the planar conductive panel 40.

While the sequence of steps of this invention may be changed for ease of production, the critical steps thereof include the following:

a. preparing a conductive panel 40 joined on a least one side thereof with a carrier support portion 42 secured to the conductive panel 40 by plural frangible webs 44 which may be readily severed after the soldering of the terminals to the conductive paths 26 on the panel 40, b. selecting an electrical receptacle assembly 10 comprising an elongated housing 14 having plural cavities 16, where each cavity 16 includes an electrical terminal 22 mounted therein, with the ends 24 of the terminals aligned within a plane (see FIG. 3), and a pair of oppositely disposed tabs or shoulders 32 extending from the housing 14, c. providing an elongated opening 48 within the carrier support portion 42 adjacent to the panel edge 46 and of a size to receive the elongated housing 14, where the shoulders 32 are adapted to lie upon the surface 50 of the carrier support portion 42, d. seating the electrical receptacle assembly 10 within the opening 48 whereby the terminal ends 24 of the electrical receptacle assembly 10 are aligned with the conductive paths 26 on the planar conductive panel 40, and each terminal end 24 contacts a corresponding conductive path 26 on the surface of the planar conductive panel 40, e. soldering the terminal ends 24 to corresponding conductive pads 26 on conductive panel 40, and f. removing the carrier support 42 from panel 40 by severing webs 44 to reveal the card edge connector illustrated in FIG. 7.

Figure 8:
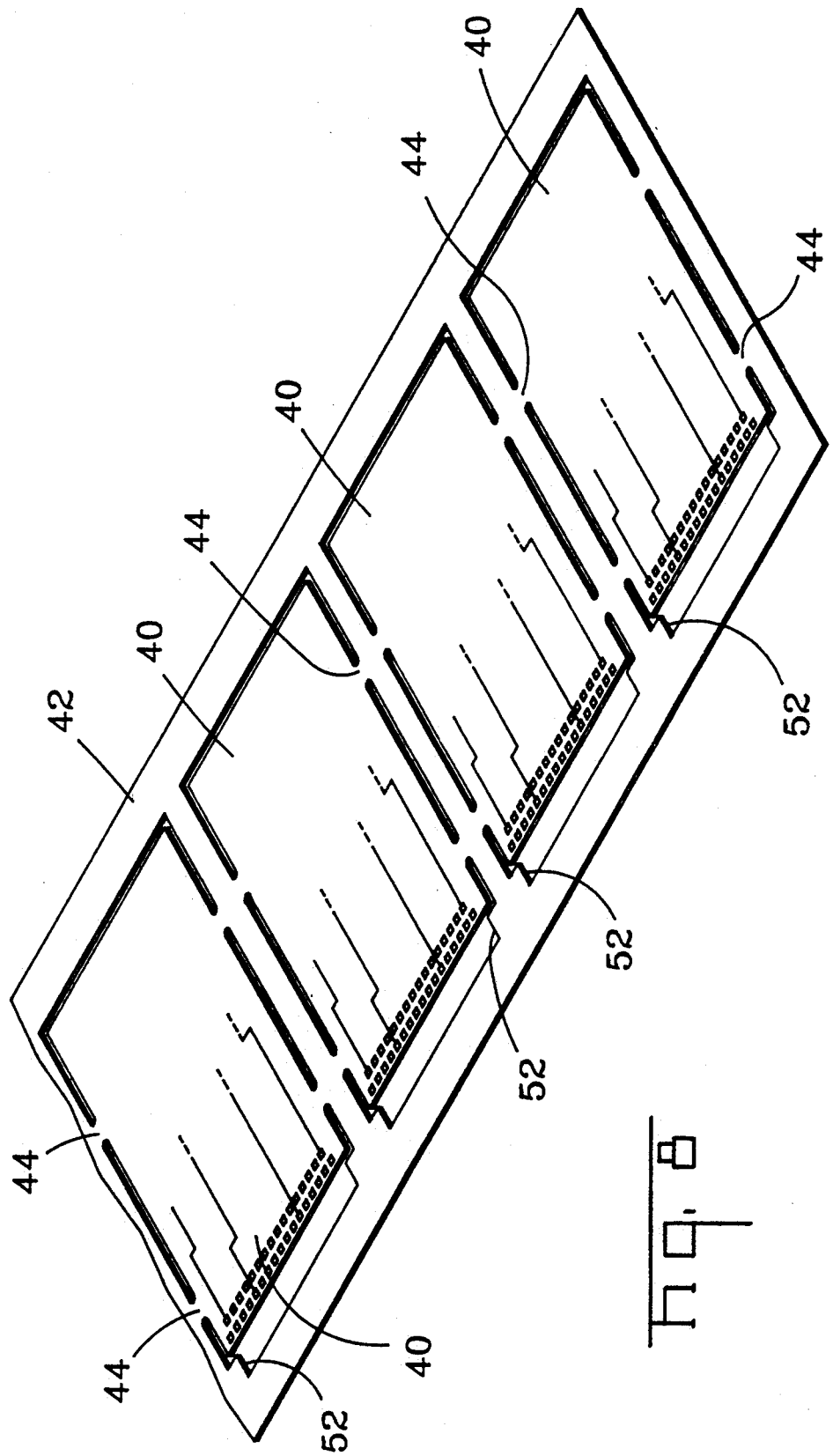
FIG. 8 is a perspective view illustrating a plurality of planar conductive panels, for use by the invention hereof, secured together by a common carrier support.

FIG. 8 represents an alternate embodiment to allow the production of multiple assemblies in a single soldering operation. In this embodiment, adjacent panels 40 are separated by a common carrier support portion 42 where the respective joints therebetween are frangible webs 44. It will be understood that, as an alternative, the multiple assemblies may be aligned in plural rows rather than a single row as illustrated in FIG. 8.

I claim:

1. A method of aligning an electrical receptacle assembly having plural electrical terminals projecting therefrom along only one side of the assembly to the edge of a substantially rectangular, planar conductive panel formed of a dielectric material, where such terminals are to be reflow soldered to electrically conductive paths on the surface of said planar conductive panel, comprising the steps of:

a. preparing a conductive panel joined on at least one side thereof with a carrier support portion secured to said conductive panel by plural frangible webs which may be readily severed after the soldering of said terminals to the conductive paths, b. selecting an electrical receptacle assembly comprising an elongated housing having plural cavities, where each cavity includes an electrical terminal mounted therein, with the ends of said terminals aligned within a plane, and a pair of oppositely disposed tabs extending from said housing, c. providing an elongated opening within said carrier support portion adjacent to said edge and of a size to receive said elongated housing, where said tabs are adapted to lie upon the surface of said carrier support portion, and d. seating said electrical receptacle assembly within said opening whereby said electrical receptacle assembly is aligned with the conductive paths on said planar conductive panel, and each said terminal end contacts a corresponding conductive path on the surface of said planar conductive panel.

2. The method according to claim 1, wherein said elongated housing includes a first side wall, and a pair of end walls from which said tabs project, where said tabs are recessed from said first side wall.

3. The method according to claim 2, wherein a wall of said recessed tab lies in the plane of said ends of said electrical terminals.

4. The method according to claim 1, wherein there are plural rows of electrical terminals extending from electrical receptacle assembly, where the terminals of a given row are offset from the terminals of an adjacent row, and that all terminal ends thereof are aligned within a single plane.

5. The method according to claim I, wherein said elongated opening is defined by at least a pair of parallel edges against which said electrical receptacle assembly is positioned to lie, and that the conductive paths are arranged in a predetermined pattern relative to said parallel edges.

6. The method according to claim 1, including the further step of soldering said terminal ends to said electrically conductive paths.

7. The method according to claim 1, including the further step of removing the carrier support from the panel be severing the frangible webs.

8. A printed circuit board assembly having an electrical connector assembly having plural electrical terminals projecting therefrom, where such terminals are to be electrically connected to conductive paths of the conductive panel, the circuit board assembly comprising:

the conductive panel has an inner panel and a peripheral support, the peripheral support is joined to the inner panel by frangible webs;

whereby the frangible webs are severed after the connector assembly is electrically connected to the conductive panel.

9. A printed circuit board assembly as recited in claim 8 wherein adjacent one edge of the inner panel is an elongated opening dimensioned to receive the connector assembly therein.

10. A printed circuit board assembly as recited in claim 9 wherein proximate the opening is a support surface along a support edge which cooperates with a shoulder of the connector assembly to align the connector assembly relative to the conductive panel.

* * * * *